(12) United States Patent
Bedell et al.

(10) Patent No.: US 10,032,973 B1
(45) Date of Patent: Jul. 24, 2018

(54) MAGNETICALLY GUIDED CHIPLET DISPLACEMENT

(71) Applicant: International Business Machines Corporation, Armonk, NY (US)

(72) Inventors: Stephen W. Bedell, Wappingers Falls, NY (US); Bing Dang, Chappaqua, NY (US); Ning Li, White Plains, NY (US); Frank R. Libsch, White Plains, NY (US); Devendra K. Sadana, Pleasantville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/416,488

(22) Filed: Jan. 26, 2017

(51) Int. Cl.
*H01L 21/00* (2006.01)
*H01L 33/62* (2010.01)
*H01L 25/075* (2006.01)

(52) U.S. Cl.
CPC .......... *H01L 33/62* (2013.01); *H01L 25/0753* (2013.01); *H01L 2933/0066* (2013.01)

(58) Field of Classification Search
None
See application file for complete search history.

(56) References Cited

U.S. PATENT DOCUMENTS

| 7,172,789 | B2 | 2/2007 | Smith et al. | |
|---|---|---|---|---|
| 7,531,218 | B2 | 5/2009 | Smith et al. | |
| 2010/0186883 | A1* | 7/2010 | Tomoda | H01L 25/0753 156/220 |
| 2011/0151588 | A1* | 6/2011 | Ashdown | H01L 21/6835 438/3 |
| 2011/0151602 | A1* | 6/2011 | Speier | H01L 33/0079 438/26 |
| 2013/0285086 | A1* | 10/2013 | Hu | H01L 27/156 257/98 |
| 2015/0023023 | A1* | 1/2015 | Livesay | H01L 33/642 362/294 |
| 2016/0336304 | A1* | 11/2016 | Wu | H01L 21/6835 |

OTHER PUBLICATIONS

Talghader, et.al., "Integration of Fluidically Self Assembled Optoelectronic Devices Using a Silicon Based Process", IEEE, Photonics Technology Letters, Nov. 1995, pp. 1321-1323, vol. 7, No. 11.

* cited by examiner

*Primary Examiner* — Angel Roman
(74) *Attorney, Agent, or Firm* — Scully, Scott, Murphy & Presser, P.C.; Louis J. Percello, Esq.

(57) ABSTRACT

Magnetic regions of at least one of chiplet or a receiving substrate are used to permit magnetically guided precision placement of chiplets on the receiving substrate. In some embodiments, a scanning magnetic head can be used to release individual chiplets from a temporary support substrate to the receiving substrate. Structures are provided in which a magnetic moment of a controlled orientation exists between the transferred chiplets and the receiving substrate.

13 Claims, 7 Drawing Sheets

MAGNETICALLY GUIDED CHIPLET DISPLACEMENT

BACKGROUND

The present application relates to a method that enables the precise placement of chiplets containing a semiconductor device layer, such as, for example, a light emitting diode (LED), on a receiving substrate. The present application also relates to a structure that includes a plurality of chiplets, each chiplet is precisely located on, and can be bonded to, a bond pad that is present on a receiving substrate. A magnetic magnetic moment is present in the structure that has a controlled orientation.

A light emitting diode (LED) is a two-lead semiconductor light source. An LED is a p-n junction diode, which emits light when activated. When a suitable voltage is applied to the leads, electrons are able to recombine with electron holes within the device, releasing energy in the form of photons. This effect is called electroluminescene, and the color of the light (corresponding to the energy of the photon) is determined by the energy band gap of the semiconductor material used to provide the p-n junction.

There is an interest in fabricating high resolution display technology using multiple colored micro-LEDs to form individual pixels. An important challenge lies in the precise placement of individual chiplets corresponding to the different LED colors. Although technologies exist which combine temporary bonding and release of singulated LED containing chiplets, the placement precision required, while retaining high throughput and low-cost, remains lacking.

SUMMARY

Magnetic regions of at least one of a chiplet or a receiving substrate are used to permit magnetically guided precision placement of a plurality of chiplets on the receiving substrate. In some embodiments, a scanning magnetic head can be used to release individual chiplets from a temporary support substrate to the receiving substrate. Structures are provided in which a magnetic moment of a controlled orientation exists between the transferred chiplets and the receiving substrate.

One aspect of the present application relates to a method of precise placement of chiplets onto a receiving substrate. In one embodiment of the present application, the method includes providing, in any order, a first structure comprising a plurality of chiplets located on a surface of a temporary support substrate, and a second structure comprising a plurality of bond pads located on a surface of a receiving substrate. Next, the first and second structures are brought into proximity to each other, and thereafter a preselected number of chiplets of the first structure are transferred to the bond pads of the second structure utilizing magnetic force of attraction.

Another aspect of the present application relates to a structure that contains chiplets precisely placed on a receiving substrate. In one embodiment of the present application, the structure includes a first set of chiplets positioned on a first set of bond pads present on a display substrate, wherein a magnetic moment of a control orientation is present between each chiplet of the first set of chiplets and each bond pad of the first set of bond pads.

DETAILED DESCRIPTION

Figure 1:
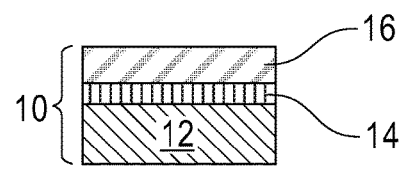
FIG. 1 is a cross sectional view of a chiplet of, from bottom to top, a semiconductor device layer, a contact structure, and a metallic layer that can be employed in accordance with an embodiment of the present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Referring first to FIG. 1, there is illustrated a chiplet 10 that can be used in accordance with an embodiment of the present application. The term "chiplet" is used throughout the present application to denote a semiconductor device or circuit that has been selected from a larger substrate and may contain metallization and dielectric regions. Chiplet 10 includes, from bottom to top, a semiconductor device layer 12, a contact structure 14, and a metallic layer 16.

The semiconductor device layer 12 of chiplet 10 includes at least one semiconductor material that has one or more semiconductor devices formed therein or thereupon. The term "semiconductor material" is used throughout the present application to denote a material that exhibits semiconducting properties. Examples of semiconductor materials that can be used to provide the semiconductor device layer 12 include, but are not limited to, silicon (Si), germanium (Ge), silicon germanium alloys (SiGe), silicon germanium carbide (SiGeC), III-V compound semiconductors or II-VI compound semiconductors. III-V compound semiconductors are materials that include at least one element from Group III of the Periodic Table of Elements and at least one element from Group V of the Periodic Table of Elements. II-VI compound semiconductors are materials that include at least one element from Group II of the Periodic Table of Elements and at least one element from Group VI of the Periodic Table of Elements.

The semiconductor material that provides the semiconductor device layer 12 may be a single material or a combination of semiconductor materials, without any other type of material located between the semiconductor materials. In some embodiments, a semiconductor-on-insulator including a handle substrate, a buried oxide, and a top semiconductor material may be used as the semiconductor device layer 12.

In one embodiment, the semiconductor device layer 12 includes a light emitting diode (LED) which includes a first semiconductor material of a first conductivity type and a second semiconductor material of a second conductivity type that is opposite from the first conductivity type; other types of semiconductor devices besides LEDs can be used in the present application. In one embodiment, the first semiconductor material is located directly above or directly below the second semiconductor material. In another embodiment, the first semiconductor material is located laterally adjacent and in direct contact with the second semiconductor material. The first and second semiconductor materials of the LED that can be used as the semiconductor device layer 12 include any semiconductor material or combination of semiconductor materials that when a suitable voltage is applied thereto, electrons are able to recombine with electron holes, releasing energy in the form of photons. Depending on the energy band gap of the first and second semiconductor materials, various colors such as, for example, red, blue or green, can be subsequently emitted therefrom. In one embodiment, the first and second semiconductor materials of the LED are both composed of a III-V semiconductor compound material such as for example, GaN or GaAs.

In one embodiment, the first conductivity type is p-type and the second conductivity type is n-type. In another embodiment, the first conductivity type is n-type and the second conductivity type is p-type. The term "p-type" refers to the addition of impurities to an intrinsic semiconductor material that creates deficiencies of valence electrons. "N-type" refers to the addition of impurities that contributes free electrons to an intrinsic semiconductor. The concentration of dopants that provide the first and second conductivity types may be from $1\times10^{18}$ atoms/cm$^3$ to $5\times10^{21}$ atoms/cm$^3$; other dopant concentrations as possible so long as a p-n junction is provided between the first and second semiconductor materials that provide the LED.

The semiconductor device layer 12 can be formed utilizing any well known process. In one embodiment, the semiconductor device layer 12 may be formed utilizing a spalling (i.e., a material removal process). Spalling is a useful technique in creating thin film devices by fracturing a surface of a crystalline substrate through use of stress created by differences in material properties of the material to be fractured and a stressor material. In embodiments in which spalling is employed, a base semiconductor substrate containing at least one material that provides the semiconductor device layer 12 is first provided: other device components may be formed upon the base semiconductor substrate. Next, a stressor layer such as a layer of nickel is formed on top of the base semiconductor substrate, wherein the stressor layer is deposited to a thickness sufficient to permit mechanically-assisted spalling of the base semiconductor substrate. A handle layer such as an adhesive tape is then formed on stressor layer and thereafter a spalled structure including a portion of the base semiconductor substrate is removed from the original base semiconductor substrate by pulling the handle layer away from the base semiconductor substrate.

The semiconductor device layer 12 may have a thickness from 100 nm to 20 microns. Other thicknesses that are lesser than, or greater than, the aforementioned thickness values may also be used as the thickness of the semiconductor device layer 12.

The contact structure 14 is formed on a first surface of the semiconductor device layer 12. In some embodiments, the contact structure 14 may be formed on the material(s) that provides the semiconductor device layer 12 prior to, or after performing a spalling process. In one embodiment and as illustrated, the contact structure 14 is a continuous material layer that is present on an entirety of the semiconductor device layer 12. In another embodiment (not illustrated in FIG. 1), the contact structure 14 is composed of discrete regions that are spaced apart from each other by a gap. Although not shown in the drawings of the present application, another contact structure can be formed on a second surface of the semiconductor device layer 12, wherein the second surface is opposite the first surface.

The contact structure 14 (and, if present the other contact structure) may include any ohmic metal or metal alloy. The ohmic metal or metal alloy that provides the contact structure 14 may be the same as, or different from, the ohmic metal or metal alloy that provides the another contact structure. Examples of ohmic metals or metal alloys that may be employed in providing the contact structure 14 (and, if present the other contact structure) include, but are not limited to, nickel, gold, silver, cobalt, aluminum, titanium, tungsten, palladium, platinum, or nickel silver. The contact structure 14 (and, if present the other contact structure) may be formed by first providing a blanket layer of an ohmic metal or metal alloy. The blanket layer of ohmic metal or metal alloy can be formed utilizing a deposition process such as, for example, chemical vapor deposition, plasma enhanced chemical vapor deposition, physical vapor deposition, atomic layer deposition, sputtering or plating. In embodiments in which the contact structure 14 is composed of discrete contact structures, a patterning process can be used. In one embodiment, patterning may be performed by lithography and etching. Lithography includes forming a photoresist (not shown) atop a material or material stack to be patterned, exposing the photoresist to a desired pattern of radiation, and developing the exposed photoresist utilizing a conventional resist developer. The photoresist may be a positive-tone photoresist, a negative-tone photoresist or a hybrid-tone photoresist. The etching process includes a dry etching process (such as, for example, reactive ion etching, ion beam etching, plasma etching or laser ablation), and/or a wet chemical etching process. Typically, reactive ion etching is used.

The contact structure 14 (and, if present the other contact structure) may have a thickness from 10 nm to 500 nm. Other thicknesses that are lesser than, or greater than, the aforementioned thickness values may also be used as the thickness of the contact structure 14 (and, if present the other contact structure).

The metallic layer 16 is formed on a surface of the contact structure 14 which is opposite the surface of the contact structure that is in contact with the semiconductor device layer 12. In some embodiments, the metallic layer 16 may formed prior to, or after, performing a spalling process. In embodiments in which the metallic layer 16 is formed prior to spalling, the metallic layer 16 can be used, in such an instance, as a stressor material of the spalling process.

In one embodiment, the metallic layer 16 is composed of a material that has magnetic properties (i.e., a magnetic material). In one embodiment of the present application, the magnetic material that may provide the metallic layer 16 is composed of a magnetic metal or metal alloy such as, for example, magnetic nickel, magnetic cobalt, magnetic iron or magnetic alloys thereof. In one embodiment, the magnetic material that provides the metallic layer 16 is composed of magnetic nickel.

In another embodiment, the metallic layer 16 is composed of a metal or metal alloy that has non-magnetic properties. Examples of non-magnetic metals or metal alloys that may be employed as metallic layer 16 include, but are not limited to, titanium, copper, tungsten, palladium, platinum and alloys thereof.

The metallic layer 16 may be formed by first providing a blanket layer of magnetic or non-magnetic material. The blanket layer of magnetic or non-magnetic material can be formed utilizing a deposition process such as, for example, chemical vapor deposition, plasma enhanced chemical vapor deposition, physical vapor deposition, atomic layer deposition, sputtering or plating. A patterning process such as, for example, lithography and etching, may following the deposition process.

The metallic layer 16 may have a thickness from 100 nm to 30000 nm. Other thicknesses that are lesser than, or greater than, the aforementioned thickness values may also be used as the thickness of the metallic layer 16.

Figure 2:
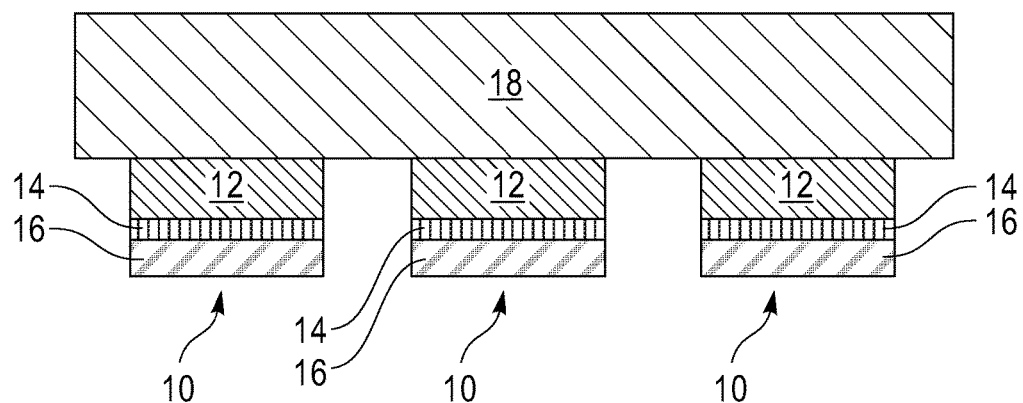
FIG. 2 is a cross sectional view of a first exemplary structure including a plurality of chiplets as shown in FIG. 1 formed on a temporary support substrate that can be employed in accordance with an embodiment of the present application.

Referring now to FIG. 2, there is illustrated a first exemplary structure including a plurality of chiplets 10 as shown in FIG. 1 formed on a temporary support substrate 18 (three are shown in FIG. 2 by way of one example of the present application). At this point of the present application, each chiplet 10 that is formed is typically of the same type. For example, each chiplet 10 may include a LED as the semiconductor device layer 12 which is capable of emitting a single color, i.e., red, blue or green. As is shown, each chiplet 10 is spaced apart from a neighboring chiplet by a gap.

In one embodiment, the temporary support substrate 18 is composed of a magnetic material that may hold each chiplet 10 on a surface thereof by magnetic force of attraction. In such an embodiment, the magnetic material that provides the temporary support substrate 18 may be composed of a same, or different magnetic material as that present in the chiplet 10 provided that the magnetic material of the temporary support substrate 18 is capable of attracting each chiplet 10 by magnetic force of attraction. When the temporary support substrate 18 is composed of a magnetic material, the force of attraction between the temporary support substrate 18 and each chiplet 10 should be less the force of attraction used to subsequently transfer the chiplets 10 to a receiving substrate.

In yet another embodiment, the temporary support substrate 18 is composed of a handler substrate such as, for example, glass or silicon. In such an embodiment, a magnetic force may be applied to the temporary support substrate 18 to attract and hold the chiplets 10 in place; this magnetic force is subsequently removed or reduced from the temporary support substrate 18 such that pre-selected chiplets can be transferred to an underlying receiving substrate. In yet another embodiment, a release layer such as a polymeric adhesive or tape layer can be used to attach each chiplet 10 to a surface of the temporary support substrate 18. The release layer may be formed on the temporary support substrate 18, each chiplet 10 or both of the temporary support substrate 18 and each chiplet 10.

Figure 3:
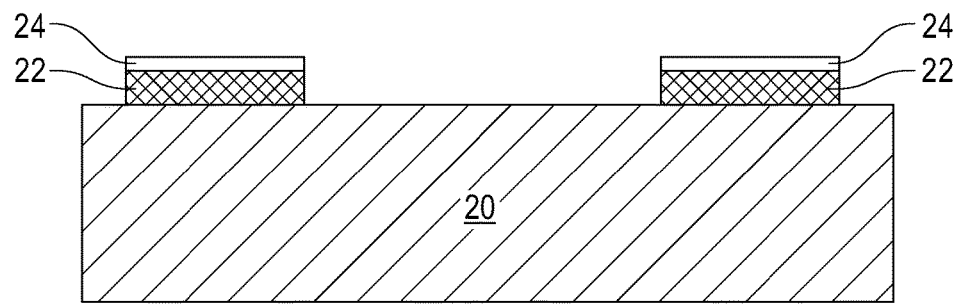
FIG. 3 is a cross sectional view of a second exemplary structure including spaced apart bond pads that are located on a surface of a receiving substrate that can be employed in accordance with an embodiment of the present application.

Referring now to FIG. 3, there is illustrated a second exemplary structure including spaced apart bond pads 22 (two of which are shown by way of one example in FIG. 3) that are located on a surface of a receiving substrate 20 that can be employed in accordance with an embodiment of the present application. Each bond pad 22 typically has a size and/or shape that matches the same and/or shape of chiplets 10 to be subsequently transferred thereto. Each bond pad 22 is formed on a pre-selected area of the receiving substrate 20. Although the present application describes and illustrates providing the first exemplary structure prior to the second exemplary structure, the two exemplary structures may be provided in any order.

Receiving substrate 20 (which may also be referred to as a display substrate) may include various materials such as, for example, a semiconductor material (such as defined above), an insulator or any combination thereof. When a semiconductor material is employed as the receiving substrate 20, the semiconductor material may be a single material or a combination of semiconductor materials. In some embodiments, a semiconductor-on-insulator including a handle substrate, a buried oxide, and a top semiconductor material may be used as the receiving substrate 20.

The insulator material that may be employed as the receiving substrate 20 includes any electrical insulating material such as, for example, glass, a ceramic (such as a carbide, an oxide or a nitride), and/or a plastic. The insulator material that can provide the receiving substrate 20 may be composed of a single electrical insulating material or a combination of electrical insulating materials. In some embodiments, a material stack, in any order, of a semiconductor material and an insulator material may be employed as the receiving substrate 20.

The receiving substrate 20 may have a thickness from few microns (e.g., 2 microns) to a few millimeters (e.g., 3 millimeters). Other thicknesses that are lesser than, or greater than, the aforementioned thickness values may be employed as the thickness of the receiving substrate 20.

In one embodiment and as shown in FIG. 3, each bond pad 22 is formed on a topmost, planar surface of the receiving substrate 20. In other embodiments, each bond pad 22 may be formed in an opening formed in the receiving substrate 20 or a mesa portion of the receiving substrate 20. The openings and mesa portions can be formed by patterning the receiving substrate 20. When such embodiments are employed, patterning may include lithography and etching as defined above.

In one embodiment, each bond pad 22 is composed of a material that has magnetic properties (i.e., a magnetic material). In embodiments in which the metallic layer 16 is also composed of a magnetic material, each bond pad 22 is composed of a material that is capable of magnetically attracting the metallic layer 16 of the chiplet 10. That is, for a given metallic layer 16 and a given bond pad 22, the two are arranged such that physically exposed surfaces of each that are facing each other have a different polarity (i.e., north or south). In cases in which the temporary support substrate 18 is magnetic, the magnetic force of the temporary support substrate 18 is less than the magnetic force of the bond pad 22 such that subsequent release of the chiplet 10 to the bond pad 22 may take place. In one embodiment, the magnetic material that may provide each bond pad 22 is composed of a magnetic metal or metal alloy such as, for example, magnetic nickel, magnetic cobalt, magnetic iron or magnetic alloys thereof. In one embodiment, the magnetic material that provides each bond pad 22 is composed of magnetic nickel.

In another embodiment, each bond pad 22 is composed of a metal or metal alloy that has non-magnetic properties. Examples of non-magnetic metals or metal alloys that may be employed as each bond pad 22 include, but are not limited to, titanium, gold, copper, tungsten, palladium, platinum and alloys thereof. In such instances, the metallic layer 16 of the chiplet should be magnetic and an external magnetic force will be subsequently used to release the chiplet 10 to the bond pad 22 on the receiving substrate 20.

Each bond pad 22 may be formed by first providing a blanket layer of magnetic or non-magnetic material. The blanket layer of magnetic or non-magnetic material can be formed utilizing a deposition process such as, for example, chemical vapor deposition, plasma enhanced chemical vapor deposition, physical vapor deposition, atomic layer deposition, sputtering or plating. The magnetic field strength and orientation of the bond pad 22 can be controlled by the orientation and strength of an applied external magnetic field during the aforementioned deposition process of the same. The blanket layer of magnetic or non-magnetic material is then patterned to provide each bond pad 22. Patterning may include lithography and etching as defined above.

Each bond pad 22 may have a thickness from 100 nm to 10000 nm. Other thicknesses that are lesser than, or greater than, the aforementioned thickness values may also be used as the thickness of the each bond pad 22.

In some embodiments, a solder material 24 such as, for example, indium, bismuth, gold, silver, tin or alloys thereof can be formed utilizing conventional techniques that are well known to those skilled in the art on a surface of bond pads 22 prior to subsequent bonding of preselected chiplets to the bond pads 22. In some embodiments, a solder material may be formed on preselected chiplets (first and third chiplets shown in FIG. 2) prior to bonding. In yet another embodiment, solder material can be formed on both the bond pads 22 and preselected chiplets prior to bonding. During a subsequently performed anneal, the solder material forms a soldered joint, i.e., permanent bond, between the preselected chiplets and the bond pads 22.

Figure 4:
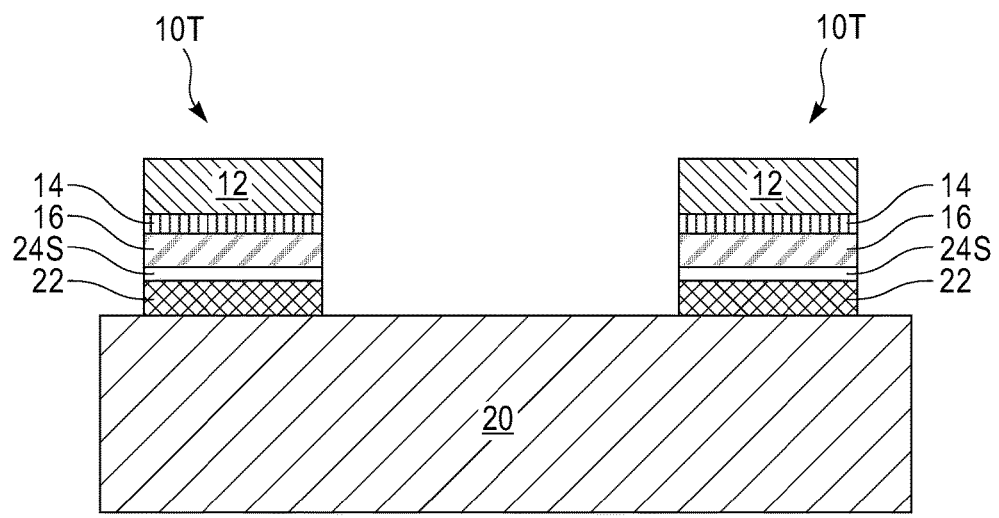
FIG. 4 is a cross sectional view of the first and second exemplary structures of FIGS. 2 and 3 after the precise placement (i.e., transferring) of some of the individual chiplets from the temporary support substrate to bond pads located on the receiving substrate and forming a permanent bond between each transferred chiplet and each bond pad.

Referring now to FIG. 4, there is illustrated the first and second exemplary structures of FIGS. 2 and 3 after the precise placement (i.e., transferring) of some of the individual chiplets 10 from the temporary support substrate 18 to bond pads 22 located on the receiving substrate 20 and forming a permanent bond between each transferred chiplet 10T and each bond pad 22; transfer chiplets 10T include the semiconductor device layer 12, the contact structure 14 and the metallic layer 16. In some embodiments, a solder joint 24S is formed between the transfer chiplet 10T and the underlying bond pad 22. The solder joint 24S is composed of the solder material 24 and it is formed after annealing. In some embodiments, permanent bonding is not performed or it can be delayed until additional chiplets of a same or different type are transferred to the receiving substrate 20.

The precise placement includes bringing the first exemplary structure shown in FIG. 2 in proximity to, but not in direct contact with, the second exemplary structure shown in FIG. 3. The distance between the two exemplary structures should be close enough to allow transfer of the chiplets 10 via magnetic force of attraction. In one embodiment, the magnetic attraction is caused by magnetic force of attraction that exists between magnetic materials that comprise both the chiplet 10 and the underlying bond pad 22. In such an embodiment, a magnetic moment is created in the structure that has a controlled orientation. In this embodiment, the controlled orientation means that the polarity of the physically exposed surface of the metallic layer 16, which is to contact the bond pad, is opposite from the polarity of the physically exposed surface of the bond pad 22. As is shown in FIG. 4, the transferred chiplets 10T are precisely placed on an underlying bond pad 22 such that the sidewalls of the transferred chiplet 10T is vertically aligned to the sidewalls of the underlying bond pad 22.

Figure 5:
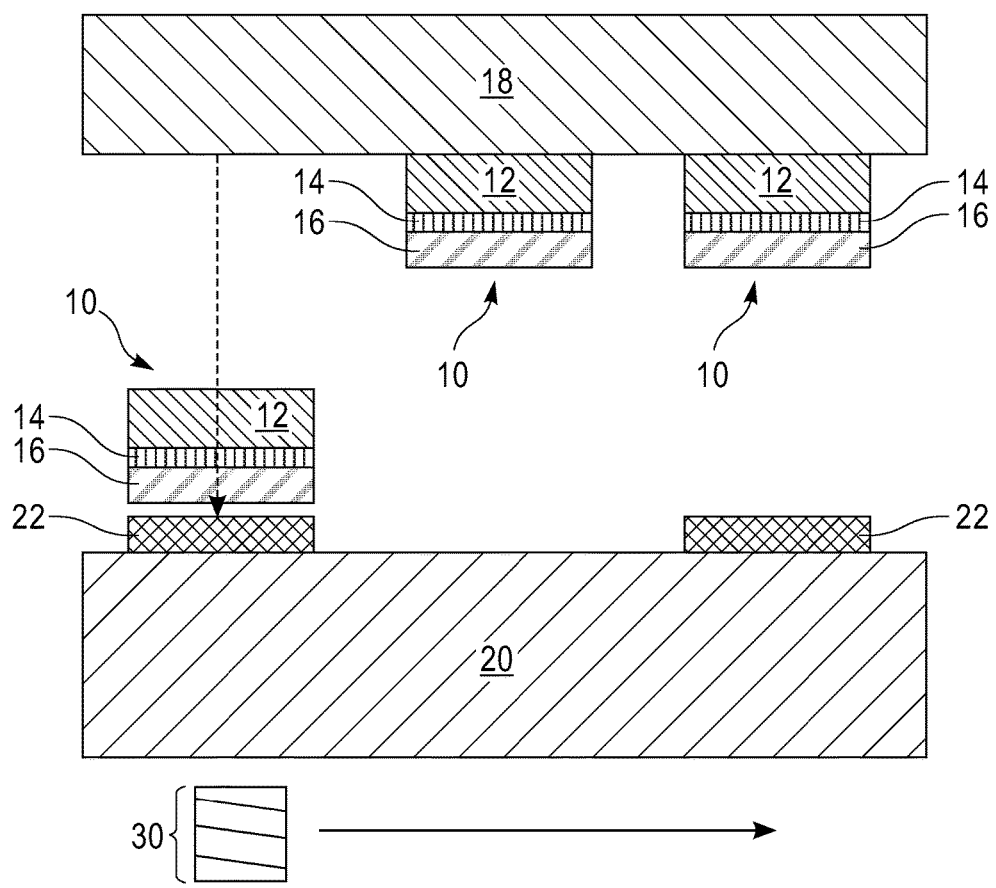
FIG. 5 is a cross sectional view of the first and second exemplary structures of FIGS. 2 and 3 after bringing the two structures in proximity to each other and utilizing a scanning magnetic head to release individual chiplets from the temporary support substrate and to allow precision placement of the released chiplets onto bond pads of the receiving substrate in accordance with an embodiment of the present application.

In other embodiments, and as shown in FIG. 5, a magnetic head 30 can be used to cause magnetic attraction between the metallic layer 16 of a preselected chiplet 10 and the underlying bond pad 22; in FIG. 5 no solder material is shown, however embodiments are contemplated in which a solder material as described above can be formed on the bond pad 22 and/or the metallic layer 16. In FIG. 5, the magnetic head 30 is capable of moving in any direction (i.e., it is a scanning magnetic head) and the magnetic head 30 is capable of inducing a magnetic field that can facilitate the transfer of a chiplet 10 to one of the bond pads 22 of the receiving substrate 20 by magnetic force of attraction. In this case, the magnetic head 30 induces a magnetic moment of a control orientation that will permit the precise placement of the chiplet 10 on the bond pad 22 via magnetic force of attraction. As is shown in FIG. 5, the chiplet 10 is precisely transferred to an underlying bond pad 22 such that the sidewalls of the resultant transferred chiplet are vertically aligned to the sidewalls of the underlying bond pad 22. Scanning of the magnetic head 30, which is typically performed beneath the receiving substrate 20, occurs over the entire surface of receiving substrate 20 to complete the transfer of all desired chiplets 10. A permanent bond between the transferred chiplets and the bond pads 22 may then be performed.

In either embodiment shown in FIG. 4 or FIG. 5, an anneal may be performed to provide a permanent bond between the transferred chiplet 10T and the underlying bond pad 22. The anneal may form solder joint 24S as mentioned above. The anneal (i.e., bonding anneal) may be performed at a temperature from 100° C. to 1000° C., depending on the annealing time. Typically higher temperature requires less annealing time. Annealing can be done by rapid thermal anneal (RTP), laser anneal, flash anneal, furnace anneal, or any suitable combination of those techniques. In one embodiment, the anneal is performed at 400° C. for 30 seconds. Other temperatures may also be used as long as the anneal temperature is capable of forming a permanent bond between each transferred chiplet 10T and the underlying bonding pad 22. In some embodiments, the anneal may be performed in an inert ambient such as, for example, helium and/or argon. In other embodiments, the anneal may be performed in a forming gas ambient. The duration of the anneal may vary so long as the duration of the anneal causes the formation of a permanent bond between each transferred chiplet 10T and the underlying bonding pad 22.

Figure 6:
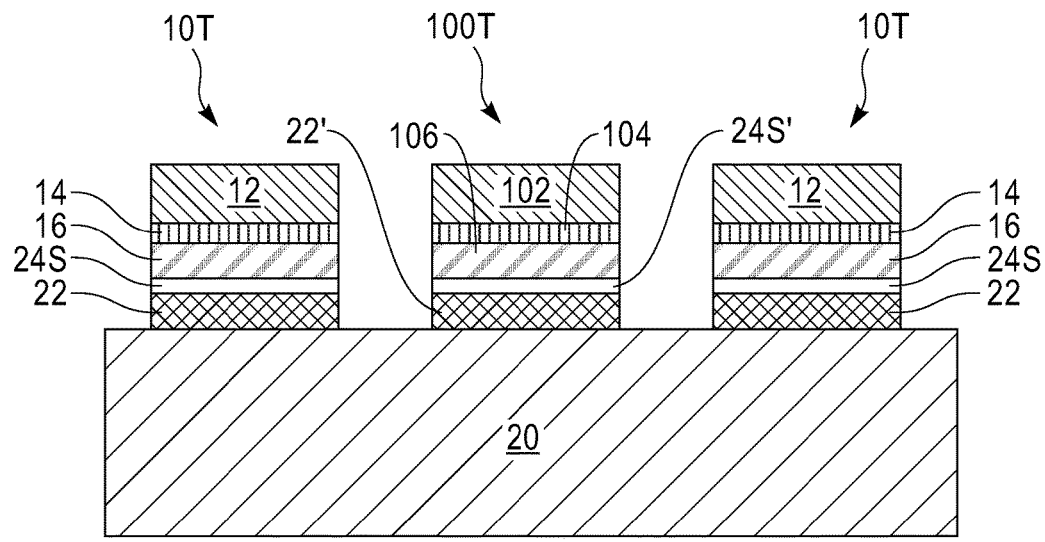
FIG. 6 is a cross sectional view of the exemplary structure of FIG. 4 after repeating the transferring and bonding process utilizing at least one second chiplet that is different from each transferred chiplet.

The above processing can be repeated any number of times to precisely place other chiplets that are different from transferred chiplets 10T onto other bond pads that are subsequently provided on the receiving substrate 20; typically the processing is repeated at least twice more to provide three different types of chiplets on the receiving substrate which may, in some embodiments, emit different colors (i.e., red, blue and green). For example, transferred chiplets 10T may include a first set of LEDS that is capable of emitting a first color. Other chiplets that include at least a second set of LEDs that is capable of emitting a second color, different from the first color, may be precisely transferred to the receiving substrate by repeating the processing steps mentioned above, i.e., chiplet creation (as shown in FIG. 1) and formation on a temporary substrate 18 (as shown in FIG. 2), formation of bond pads (as shown in FIG. 3) on preselected areas of receiving substrate 20, and placing (i.e., transferring) and optionally bonding the second set of chiplets to the newly formed bond pads on the receiving substrate (as shown in FIG. 4 of 5). FIG. 6 illustrates such an embodiment. In FIG. 6, element 100T denotes a second chiplet that is composed of a semiconductor material layer 102, a contact structure 104 and a metallic layer 106 bonded to bond pad 22' via solder joint 24S'. Additional chiplets (i.e., at least a third set of chiplets) having different colors can be transferred to the receiving substrate by repeating the process of the present application.

Figure 9:
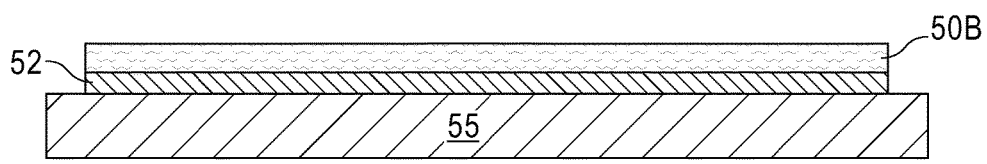
FIG. 9 is a cross sectional view after mounting the spalled structure of FIG. 8 on a temporary support substrate.
Figure 10:
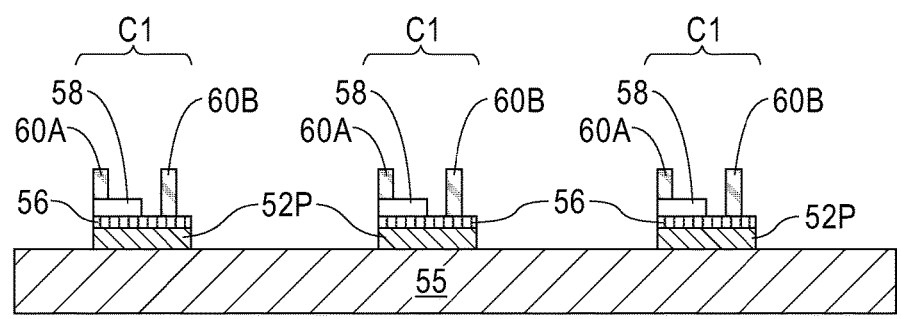
FIG. 10 is a cross sectional view of the structure shown in FIG. 9 after LED processing.
Figure 11:
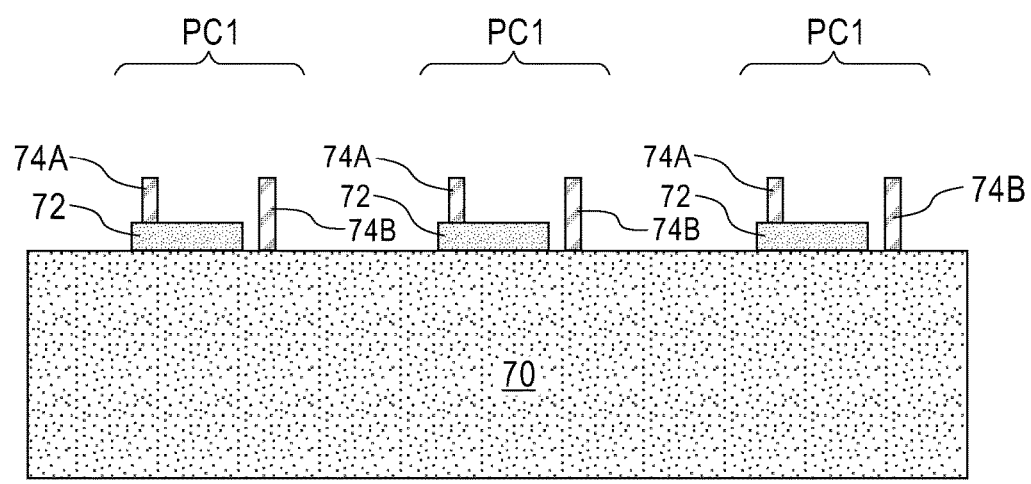
FIG. 11 is a cross sectional view of a fourth exemplary structure containing pre-LED chiplets formed on a base semiconductor substrate that can be employed in accordance with an embodiment of the present application.
Figure 12:
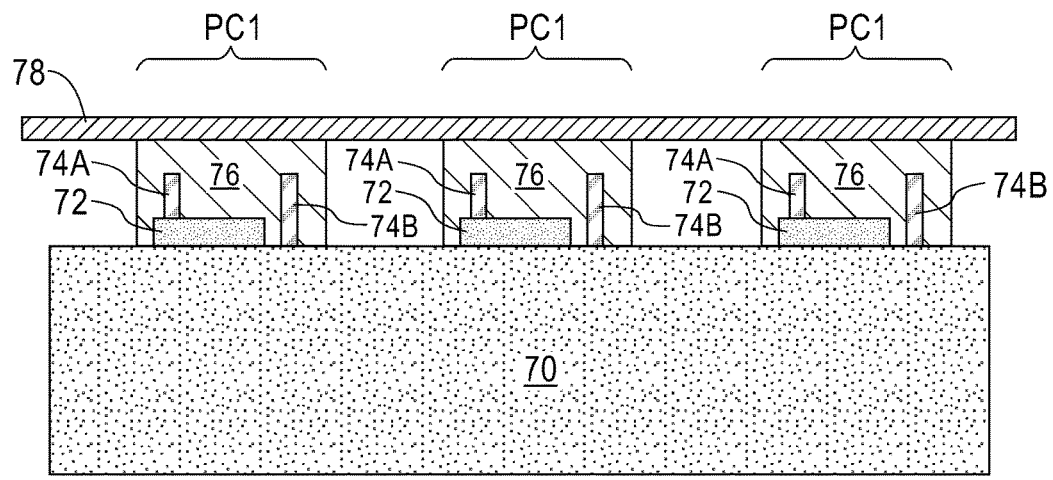
FIG. 12 is a cross sectional view of the fourth exemplary structure of FIG. 11 after forming discrete magnetic stressor structures on the base semiconductor substrate, wherein each discrete magnetic structure laterally surrounds and is located above one of the pre-LED chiplets, and after forming a handle substrate.
Figure 13:
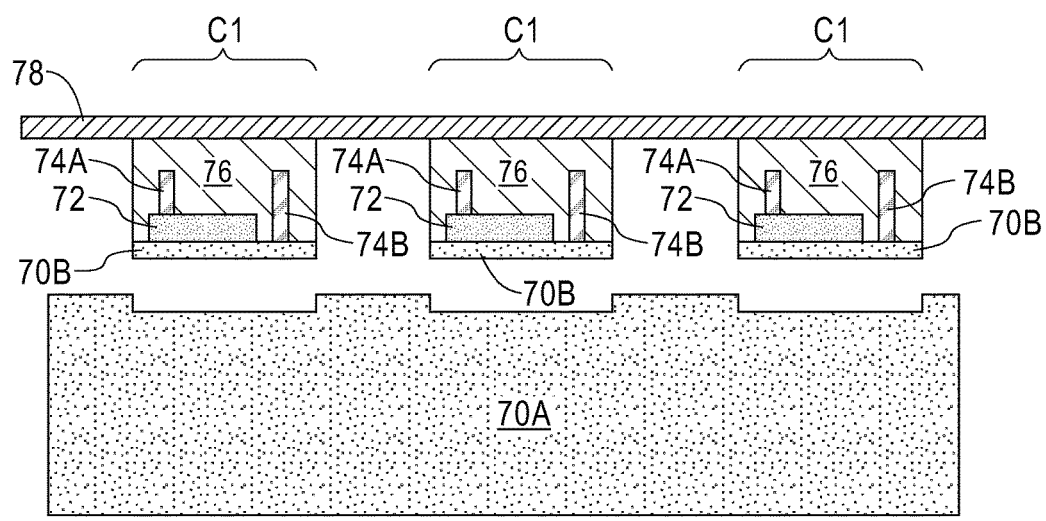
FIG. 13 is a cross sectional view of the fourth exemplary structure of FIG. 12 after performing a spalling process to provide LED chiplets from each pre-LED chiplet.

Reference is now made to FIGS. 7-13 in which LED chiplets are formed utilizing a spalling process. Although FIGS. 7-13 describe and illustrate the formation of LED chiplets utilizing spalling, the spalling process described and illustrated in FIGS. 7-13 can be used to form other chiplets. Notably, FIGS. 7-10 illustrate LED chiplet formation utilizing a non-selective spalling process, while FIGS. 11-13 illustrate LED chiplet formation utilizing a selective spalling process.

Figure 7:
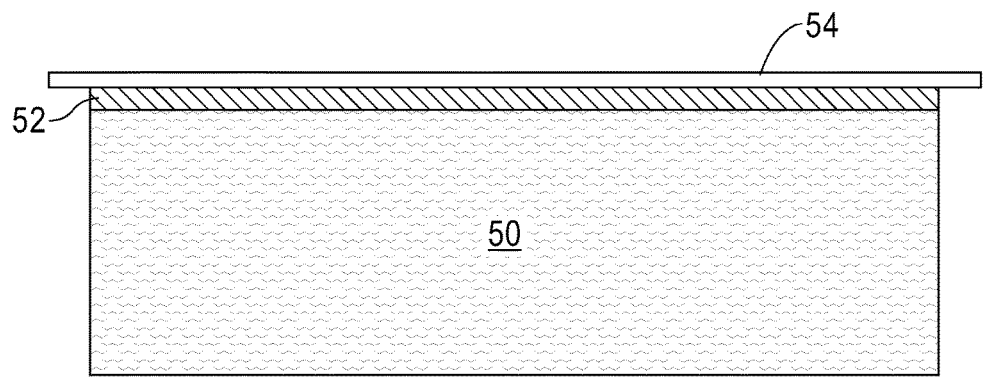
FIG. 7 is a cross sectional view of a third exemplary structure including a base semiconductor substrate, a magnetic stressor layer and a handle substrate that can be employed in accordance with an embodiment of the present application.

Referring first to FIG. 7, there is illustrated a third exemplary structure that can be employed in a non-selective spalling process in accordance with an embodiment of the present application. The structure shown in FIG. 7 includes, from bottom to top, a base semiconductor substrate 50, a magnetic stressor layer 52 and a handle substrate 54.

The base semiconductor substrate 50 includes any semiconductor material. In the illustrated embodiment, the semiconductor material that provides the base semiconductor substrate 50 includes any semiconductor material that can be used in LED fabrication such as, for example, a III-V compound semiconductor material. In some embodiments, the base semiconductor substrate 50 may be composed of an intrinsic semiconductor material. In other embodiments, the base semiconductor substrate 50 may be of first conductivity type (i.e., it may contain an n-type or p-type dopant therein). The base semiconductor substrate 50 may have a thickness from 50 microns to 2 millimeters.

Next, the magnetic stressor layer 52 is formed on a surface of the base semiconductor substrate 50. In the illustrated embodiment, the magnetic stressor layer 52 is a continuous layer that is formed over the entirety of the base semiconductor substrate 50. The magnetic stressor layer 52 is composed of a magnetic material that can introduce a stress into the base semiconductor substrate 50. Examples of magnetic materials that can be used as the magnetic stressor layer 52 include, for examples, magnetic nickel, magnetic cobalt, magnetic iron or magnetic alloys thereof. In one embodiment, the magnetic material that provides the metallic stressor layer 52 is composed of magnetic nickel.

The magnetic stressor layer 52 can be formed utilizing a deposition process such as, for example, chemical vapor deposition, plasma enhanced chemical vapor deposition, physical vapor deposition, atomic layer deposition, sputtering or plating. The magnetic stressor layer 52 has a thickness that thickness that is sufficient to permit mechanically-assisted spalling of the underlying base semiconductor substrate 50. In one example, the magnetic stressor layer 52 may have a thickness from 1000 nm to 30000 nm.

Handle substrate 54 is then formed on a physically exposed surface of the magnetic stressor layer 52. The handle substrate 54 typically has a length that extends beyond the length of the underlying material stack of the base semiconductor substrate 50 and the magnetic stressor layer 52. The handle substrate 54 of this embodiment includes a releasable film such as, for example, an adhesive film. The handle substrate 54 is used to guide crack propagation in the base semiconductor substrate 50 induced by the magnetic stressor layer 52 during spalling. The handle substrate 54 can be formed on the physically exposed surface of the magnetic stressor layer 52 by hand or mechanical means.

Figure 8:
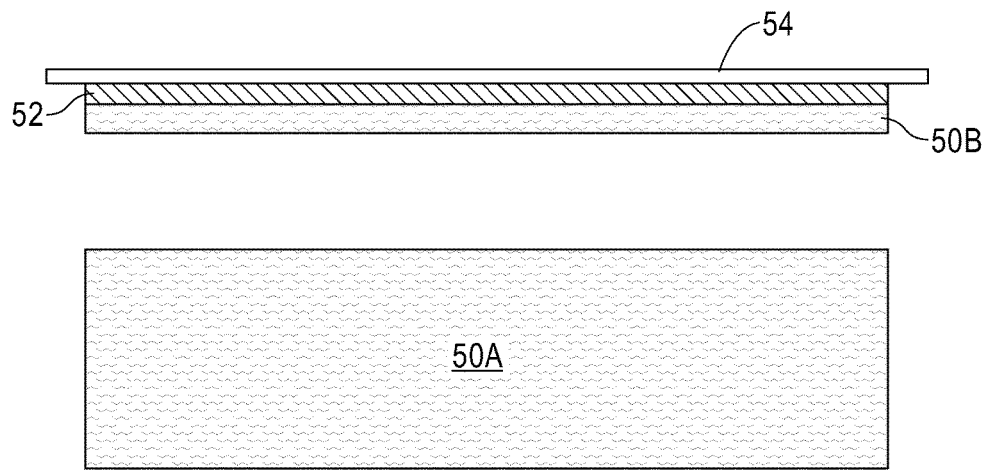
FIG. 8 is a cross sectional view of the third exemplary structure of FIG. 7 after performing a spalling process in which a spalled structure is provided.

Referring now to FIG. 8, there is illustrated the third exemplary structure of FIG. 7 after performing a spalling process in which a spalled structure (50B, 52, 54) is provided. As is shown, spalling removes an upper portion of the base semiconductor substrate 50. The removed upper portion of the base semiconductor substrate 50 is referred to herein as a spalled semiconductor material portion 50B; the remaining base semiconductor substrate 50 after spalling is referred to herein as a base semiconductor material portion 50A.

In one embodiment, spalling includes pulling or peeling the handle substrate 54 to remove the spalled structure (50B, 52, 54). Spalling includes crack formation and propagation within the base semiconductor substrate 50 induced by the magnetic stressor layer 52. In some embodiments, spalling may be initiated at substantially room temperature (i.e., 15° C. to 40° C.). In other embodiments, spalling can be performed at a temperature from 100° C. and below (it is possible to spall at temperatures below 0° C.). In some embodiments, spalling can be initiated by lowering the temperature at a fixed continuous rate. By "fixed continuous rate" it is mean, for example, 20° C. per second utilizing an electronically controlled cooling table or chamber. This method of cooling allows one to reach a pre-specified temperature at which user-defined spalling initiation can induce a pre-determined spalling depth that may be different than that dictated by mere structural parameters (i.e., stressor layer stress and thickness, and fracture toughness of substrate).

After spalling, and if not previously done, a dopant (n-type or p-type) can be introduced into the spalled semiconductor material portion 50B by utilizing any well known doping process such as, for example, gas phase doping or ion implantation. The doping of the spalled semiconductor material portion 50B may be performed after mounting the spalled structure (50B, 52, 54) to a temporary support substrate and removal of the handle substrate 54 therefrom.

Referring now to FIG. 9, there is illustrated the spalled structure of FIG. 8 after mounting the spalled structure (50B, 52, 54) on a temporary support substrate 55. Prior to mounting, the handle substrate 54 is removed by hand or mechanical means so as to physically expose a surface of the magnetic stressor layer 52. The physically exposed surface of the magnetic stressor layer 52 is then mounted to the temporary support substrate 55 by magnetic means or adhesion. If not previously done, doping of the spalled semiconductor material portion 50B can be performed after mounting to provide a first conductivity type dopant to the spalled semiconductor material portion 50B.

The temporary support substrate 55 may include one of materials mentioned above for temporary support substrate 18. That is, temporary support substrate 55 may be a magnetic material, a handler substrate, or a release layer such as a polymeric tape.

Referring now to FIG. 10, there is illustrated the structure shown in FIG. 9 after LED processing. In FIG. 10, C1 denotes a first set of LED chiplets that include a first semiconductor material layer 56 of a first conductivity type, a second semiconductor material layer 58 of a second conductivity type that is opposite from the first conductivity type, and top contact structures 60A and 60B. As is shown, top contact structure 60A is in direct contact with a topmost surface of the second semiconductor material layer 58, while the second contact structure 60B is in direct contact with a topmost surface of the first semiconductor material layer 56. Beneath each LED chiplet, C1, is a magnetic contact structure 52P.

Each LED chiplet, C1, of the first set of LED chiplets can be formed by first introducing a dopant into an upper portion of the spalled semiconductor material portion 50B such that the upper portion of the spalled semiconductor material portion has an opposite conductivity (i.e., second conductivity) than the first conductivity of the lower portion of the spalled semiconductor material portion 50B; the upper portion of the spalled semiconductor material portion 50B is used in providing the second semiconductor material layer 58 of each chiplet C1, while the lower portion of the spalled semiconductor material portion 50B is used in providing the first semiconductor material layer 56 of each chiplet, C1. A p-n junction exists between the first and second semiconductor material layers (56, 58). The material stack of the first and second semiconductor materials having the opposite conductivity type, together with the underlying magnetic stressor layer 52P are then patterned to form the first and second semiconductor material layers (56, 58) and the magnetic contact structure 52P (element 52P represents a portion of the magnetic stressor layer 52 that remains after patterning) of each chiplet, C1. Patterning may be achieved by lithography and etching, as defined above.

Top contact structures 60A, 60B are then formed. The top contact structures 60A, 60B may include any ohmic metal or metal alloy. Examples of ohmic metals or metal alloys that may be employed as the top contact structures include one of the materials mentioned above for contact structure 14; e.g., nickel, gold, silver, cobalt, aluminum, titanium, tungsten, palladium, platinum, or nickel silver. The top contact structures 60A, 60B can be formed by deposition of a blanket layer of an ohmic metal or metal alloy, followed patterning the blanket layer of ohmic metal or metal alloy. In one embodiment, patterning may be performed by lithography and etching. The top contact structures 60A, 60B have topmost surfaces that are typically coplanar with each other.

Selected LED chiplets, C1, of the first set of LED chiplets can then be transferred to preselected areas of a receiving substrate containing at least bond pads utilizing the transfer process and, optional, bond process, mentioned above and as shown in FIGS. 3-4 or FIG. 5 of the present application. Additional sets of LED chiplets that emit a different color than the first set chiplets C1 can be made utilizing the processing described and illustrated in FIGS. 7-10 and thereafter transferred to other preselected areas of the same receiving substrate also utilizing the transfer process, and optional bond process, mentioned above and as shown in FIGS. 3-4 or FIG. 5.

Referring now to FIG. 11, there is illustrated a fourth exemplary structure that can be employed in accordance with an embodiment of the present application. The structure shown in FIG. 11 includes a first set of pre-LED chiplets, PC1, formed on a base semiconductor substrate 70.

The base semiconductor substrate 70 includes any semiconductor material. In the illustrated embodiment, the semiconductor material that provides the base semiconductor substrate 70 includes any semiconductor material that can be used in LED fabrication such as, for example, a III-V compound semiconductor material. In some embodiments, the base semiconductor substrate 70 may be composed of an intrinsic semiconductor material. In other embodiments, the base semiconductor substrate 70 may be of first conductivity type (i.e., it may contain an n-type or p-type dopant therein). The base semiconductor substrate 70 may have a thickness from 50 microns to 2 millimeters.

Each pre-chiplet, PC1, of the first set of pre-chiplets includes a semiconductor layer 72 of a second semiconductor material of a second conductivity that is opposite the first conductivity. The second semiconductor material that provides semiconductor layer 72 may be the same as, or different from, the semiconductor material that provides the base semiconductor substrate 70 provided that the second semiconductor material of the semiconductor layer 72 can be used as a component of an LED. The semiconductor layer 72 of each pre-chiplet, PC1, can be formed by epitaxially growing a blanket layer of the second semiconductor material on the base semiconductor substrate 70 via an epitaxial growth or deposition process. The terms "epitaxially growing and/or depositing" and "epitaxially grown and/or deposited" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. Examples of various epitaxial growth process apparatuses that can be employed in the present application include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition typically ranges from 500° C. to 1100° C. Although higher temperature typically results in faster deposition, the faster deposition may result in crystal defects and film cracking. The epitaxial growth of the blanket layer of second semiconductor material can be performed utilizing any well known precursor gas or gas mixture. Carrier gases like hydrogen, nitrogen, helium and argon can be used. A dopant that provides a second conductivity type to the second semiconductor material may be added during the epitaxial growth process or after epitaxial growth of the second semiconductor material via gas phase doping or ion implantation.

After providing the blanket layer of the second semiconductor material, the blanket layer of the second semiconductor material is then patterned to form a plurality of semiconductor layers 72 on different portions of the base semiconductor substrate 70.

After providing the semiconductor layers 72, top contact structures 74A, 74B are formed. Top contact structures 74A, 74B may include one of the ohmic materials mentioned above for top contact structures 60A, 60B, and top contact structures 74A, 74B may be formed utilizing the technique mentioned above for forming top contact structures 60A, 60B. Top contact structure 74A contacts a topmost surface of each semiconductor layer 72, while top contact structure 74B contacts a topmost surface of the base semiconductor substrate 70.

Referring now to FIG. 12, there is illustrated the fourth exemplary structure of FIG. 11 after forming discrete magnetic stressor structures 76 on the base semiconductor substrate 70, wherein each discrete magnetic structure laterally surrounds and is located above one of the pre-LED chiplets, and after forming a handle substrate 78. Each discrete magnetic structure 76 includes one of the magnetic stressor materials mentioned above for magnetic stressor layer 52. Each discrete magnetic structure 76 can be formed by depositing a blanket layer of a magnetic stressor material and thereafter patterning the blanket layer of magnetic stressor material. Patterning may include lithography and etching, as defined above.

Handle substrate 78 may include one of the materials mentioned above for handle substrate 54. Handle substrate 78 may be formed on the structure of this embodiment utilizing one of the techniques mentioned above for forming handle substrate 54 to the magnetic stressor material 52 of the third exemplary structure of the present application.

Referring now to FIG. 13, there is illustrated the fourth exemplary structure of FIG. 12 after performing a spalling process to provide LED chiplets, C1, from each pre-LED chiplet, PC1. Each chiplet, C1, includes a spalled semiconductor material portion 70B, a semiconductor layer 72, top contacts 74A, 74B and discrete magnetic structure 76; element 70A denotes a remaining portion of the base semiconductor substrate 70A. The spalled semiconductor material portion 70B constitutes a removed semiconductor portion of the base semiconductor substrate 70. If not previously doped, a dopant can be added to the spalled semiconductor material portion 70B to provide a first conductivity to the spalled semiconductor material portion 70B.

Selected LED chiplets, C1, of the structure shown in FIG. 13 can be transferred to preselected areas of a receiving substrate containing at least bond pads utilizing the transfer process, and optional bonding process, mentioned above and as shown in FIGS. 3-4 or FIG. 5 of the present application. Additional sets of LED chiplets that emit a different color than chiplets C1 can be made utilizing the processing described and illustrated in FIGS. 11-13 and thereafter transferred to other preselected areas of the same receiving substrate also utilizing the transfer process, an optional bonding process, mentioned above and as shown in FIGS. 3-4 or FIG. 5.

It is again noted that any of the above described embodiments can, in some instances, be used to precisely place at least three different sets of chiplets on a receiving substrate via magnetic force of attraction. In one example, the first set of chiplets may emit a first color, a second set of chiplets may emit a second color different from the first color, and the third set of chiplets may emit a third color that is different from both the first and second colors.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A structure comprises:
   a first set of chiplets positioned on a first set of bond pads present on a display substrate, wherein a magnetic moment of a control orientation is present between each chiplet of the first set of chiplets and each bond pad of the first set of bond pads, wherein each chiplet of the first set of chiplets includes a semiconductor device layer, a contact structure and a metallic layer, and wherein the metallic layer of each chiplet of the first set of chiplets is composed of a magnetic metal or metal alloy, and each bond pad of the first set of bond pads is composed of a magnetic metal or metal alloy.

2. The structure of claim 1, wherein the semiconductor device layer of each chiplet of the first set of chiplets comprises a light emitting diode (LED).

3. The structure of claim 2, wherein the LED comprises a first semiconductor material of a first conductivity type and a second semiconductor material of a second conductivity type that is opposite from the first conductivity type.

4. The structure of claim 3, wherein the first semiconductor material comprises a spalled semiconductor material portion of a base semiconductor substrate.

5. The structure of claim 3, wherein the contact structure comprises a pair of top contact structures, wherein one of the top contact structures contacts the first semiconductor material, and the other top contact structure contacts the second semiconductor material.

6. The structure of claim 1, wherein a soldered joint is present between each chiplet of the first set of chiplets and each bond pad of the first set of bond pads.

7. The structure of claim 1, further comprising a second set of chiplets positioned on a second set of bond pads present on the display substrate, wherein a magnetic moment of a control orientation is present between each chiplet of the second set of chiplets and each bond pad of the second set of bond pads.

8. The structure of claim 7, wherein each first set of chiplets emits a first color and each set second of chiplets emits a second color different from the first color.

9. The structure of claim 8, further comprising a third set of chiplets positioned on a third set of bond pads present on the display substrate, wherein a magnetic moment of a control orientation is present between each chiplet of the third set of chiplets and each bond pad of the third set of bond pads, and wherein each chiplet of the third set of chiplets emits a third color, wherein the third color is different from both the first and second colors.

10. A structure comprises:
a first set of chiplets positioned on a first set of bond pads present on a display substrate, wherein a magnetic moment of a control orientation is present between each chiplet of the first set of chiplets and each bond pad of the first set of bond pads, wherein each chiplet of the first set of chiplets includes a semiconductor device layer, a contact structure and a metallic layer, and wherein the semiconductor device layer of each chiplet of the first set of chiplets comprises a light emitting diode (LED) and the LED comprising a first semiconductor material of a first conductivity type and a second semiconductor material of a second conductivity type that is opposite from the first conductivity type, and further wherein the contact structure comprises a pair of top contact structures, wherein one of the top contact structures contacts the first semiconductor material, and the other top contact structure contacts the second semiconductor material.

11. The structure of claim 10, wherein the first semiconductor material comprises a spalled semiconductor material portion of a base semiconductor substrate.

12. A structure comprises:
a first set of chiplets positioned on a first set of bond pads present on a display substrate, wherein a magnetic moment of a control orientation is present between each chiplet of the first set of chiplets and each bond pad of the first set of bond pads; and
a second set of chiplets positioned on a second set of bond pads present on the display substrate, wherein a magnetic moment of a control orientation is present between each chiplet of the second set of chiplets and each bond pad of the second set of bond pads, wherein each first set of chiplets emits a first color and each set second of chiplets emits a second color different from the first color.

13. The structure of claim 12, further comprising a third set of chiplets positioned on a third set of bond pads present on the display substrate, wherein a magnetic moment of a control orientation is present between each chiplet of the third set of chiplets and each bond pad of the third set of bond pads, and wherein each chiplet of the third set of chiplets emits a third color, wherein the third color is different from both the first and second colors.

\* \* \* \* \*